(12) United States Patent
Conner et al.

(10) Patent No.: US 8,464,902 B2
(45) Date of Patent: Jun. 18, 2013

(54) APPARATUS AND METHOD FOR PULSED DISPENSING OF LIQUID

(75) Inventors: Scott A. Conner, Foxboro, MA (US);
William MacIndoe, Exeter, RI (US);
Raymond W. Tetreault, West Greenwich, RI (US)

(73) Assignee: Nordson Corporation, Westlake, OH (US)

( * ) Notice: Subject to any disclaimer, the term of this patent is extended or adjusted under 35 U.S.C. 154(b) by 1060 days.

(21) Appl. No.: 12/351,483

(22) Filed: Jan. 9, 2009

(65) Prior Publication Data

US 2010/0176161 A1    Jul. 15, 2010

(51) Int. Cl.
*B67B 7/00* (2006.01)

(52) U.S. Cl.
USPC .................................. 222/1; 222/61; 222/389

(58) Field of Classification Search
USPC .... 222/61, 389, 394, 1, 56, 399; 251/62–63.6
See application file for complete search history.

(56) References Cited

U.S. PATENT DOCUMENTS

| | | | |
|---|---|---|---|
| 3,347,418 A | 10/1967 | Fefferman | |
| 3,921,858 A * | 11/1975 | Bemm | 222/146.5 |
| 4,601,310 A * | 7/1986 | Phillips | 137/556 |
| 4,874,444 A * | 10/1989 | Satou et al. | 156/64 |
| 5,188,258 A * | 2/1993 | Iwashita | 222/61 |
| 5,199,607 A * | 4/1993 | Shimano | 222/55 |
| 5,878,957 A * | 3/1999 | Takado et al. | 239/71 |
| 2006/0163277 A1* | 7/2006 | Vidal | 222/55 |

FOREIGN PATENT DOCUMENTS

WO    2005/036294 A1    4/2005

OTHER PUBLICATIONS

European Patent Office, European Search Report in EP Application No. 09178000, Feb. 17, 2012.
The State Intellectual Property Office of the People'S Republic of China, Office Action in Chinese Application No. 201010001515.5, Nov. 26, 2012.

* cited by examiner

*Primary Examiner* — Kevin P Shaver
*Assistant Examiner* — Daniel R Shearer
(74) *Attorney, Agent, or Firm* — Wood, Herron & Evans, L.L.P.

(57) ABSTRACT

An apparatus and method for pulsed dispensing of liquid. The apparatus includes a syringe body structure communicating with an input passage for pressurized actuation air, and communicating with an exit passage for allowing discharge of the liquid. An air input passage flow air controller is operative to increase the flow rate of the input air in accordance with a relationship that depends at least partially on a reduction of liquid volume in the syringe body structure resulting from a previous pulsed dispensing operation.

6 Claims, 2 Drawing Sheets

APPARATUS AND METHOD FOR PULSED DISPENSING OF LIQUID

TECHNICAL FIELD

The present invention generally relates to dispensing small amounts of liquid and, more particularly, dispensing small amounts of liquid from syringe-type dispensers.

BACKGROUND

Various types of liquids, such as glue or adhesive, or other viscous liquids, are dispensed from a syringe using a timed pressure pulse. The dispensing operation result in the formation of a dot of liquid on a substrate, such as an electronic circuit board. In many applications the size or volume of the dot dispensed during the timed pressure pulse is small and must be held to strict tolerances.

Known syringe dispensers often utilize pressurized actuation air to force the liquid from the syringe. That is, a short burst of pressurized air into the syringe forces the small amount of liquid from the syringe. After successive pulsed dispensing operations, the volume of the liquid in the syringe decreases, and the remaining volume in the syringe must fill with pressurized actuation air. As the air volume or space in the syringe increases due to the concurrent decrease in space occupied by the liquid volume, the time to reach the actuation air pressure increases. Therefore, for short dispense cycle times the proper actuation air pressure will not be reached, and this will affect the dot size or liquid output volume of the successive dispense cycles. More specifically, if the dispensing system does not compensate for this situation, the liquid discharge volume or dot size will decrease as the volume of the liquid retained in the syringe decreases. One known compensation method is to use an actuation air pulse of varying time to compensate for the changing air and liquid volume in the syringe. That is, as the liquid volume in the syringe decreases, the duration time of the actuation air burst is increased.

SUMMARY OF THE INVENTION

An apparatus is provided for pulsed dispensing of liquid comprising a syringe body structure and an actuation air input passage flow rate controller. The syringe body structure communicates with an input passage for pressurized actuation air and also communicates with an exit or discharge passage for the liquid to be dispensed. The air input flow rate controller is operative to increase the flow rate of the input air in accordance with a relationship that depends at least partially on a reduction of liquid volume in the syringe body structure resulting from one or more previous pulsed dispensing operations.

The air input flow rate controller may take various forms. For example, the flow rate controller may be a needle valve or a proportional valve. An air input flow rate controller can also be incorporated directly into the syringe body structure. For example, the apparatus can include a piston mounted for reciprocating movement within the syringe body structure. The piston defines a liquid space on a side of the piston communicating with the exit passage and an air space on a side of the piston communicating with the air input passage. In this example, the air input flow rate controller may further comprise an elongate member extending from the piston through the air input passage. The elongate member reduces in diameter in a direction away from the exit passage. For example, this reduction in diameter may be in the form of a continuous taper or, even more specifically, generally a cone-shaped elongate member.

A method of dispensing controlled amounts of liquid from a syringe dispenser is also provided. The method generally comprises coupling a supply of pressurized actuation air to a syringe body structure through an input passage. A first timed pulse of the actuation air is supplied through the input passage to thereby expel a first amount of liquid through an exit. The input air flow rate is then increased in accordance with a relationship depending at least partially on a reduction of liquid volume in the syringe body structure. A second timed pulse of the actuation air is then supplied through the input passage at the higher flow rate to thereby expel a second amount of the liquid through the exit passage. This can allow, for example, the second amount to be at least substantially the same as the first amount or, in other words, can achieve more consistent dispense volumes as the liquid volume in the syringe dispenser decreases.

As further aspects of the method, the air input passage can have an annularly shaped cross-section and increasing the air flow rate can generally involve enlarging a cross sectional area of the input passage. For example, this can comprise increasing or enlarging the area of the annularly shaped cross-section. Increasing the area of the annularly shaped cross-section can further comprise moving an elongate member through the input passage, and the elongate member may be a continuously tapered member such as a generally cone-shaped member. Supplying the first and second timed pulses of actuation air may further comprise supplying the actuation air against a piston mounted for reciprocating movement in the syringe body structure.

Various additional details and features of the invention will become more readily apparent to those of ordinary skill in the art upon review of a more detailed description of illustrative or exemplary embodiments taken in conjunction with the accompanying drawings.

DETAILED DESCRIPTION OF THE ILLUSTRATIVE EMBODIMENTS

Figure 1:
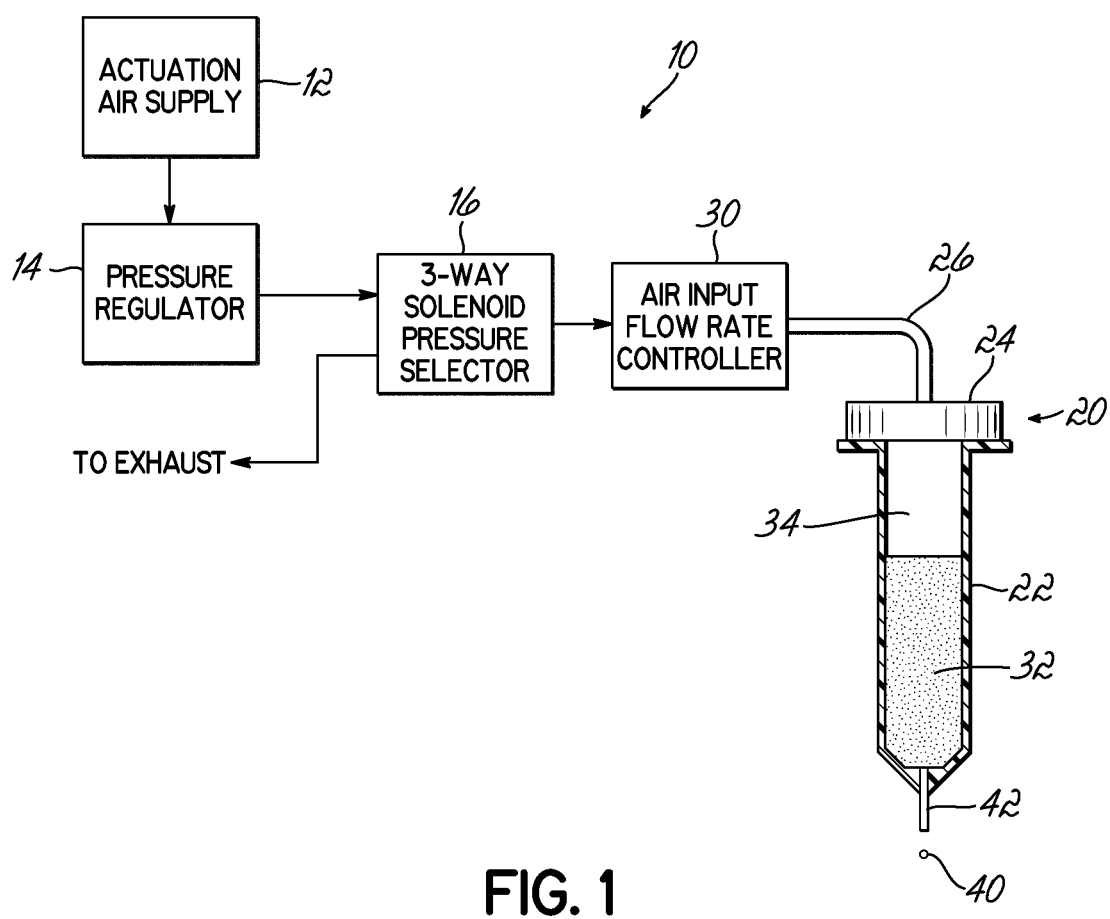
FIG. 1 is a schematic view of an apparatus constructed in accordance with one illustrative embodiment.

FIG. 1 illustrates an apparatus 10 generally including an actuation air supply 12 directing air through a pressure regulator 14 to a three-way solenoid pressure selector 16. The three-way solenoid pressure selector 16 provides pulses of the pressurized actuation air into a syringe 20 comprised of a syringe body structure 22 and an adaptor 24. The pressure regulator 14 sets the amplitude of the air pressure pulse in a known manner. The pressure selector solenoid valve 16 is used to pressurize and exhaust the air space 34 of the syringe dispenser in a known manner. Tubing 26 provides an air path between an input passage flow rate controller 30 and the adaptor 24.

FIG. 1 represents an apparatus that is conventional except for the provision of the air input flow rate controller 30. The syringe body structure 22 includes liquid 32 to be dispensed, and occupying a certain volume of the body structure. The syringe body structure also includes an actuation air space 34 which occupies the remaining volume. It will be understood, therefore, that as the liquid volume 32 decreases during successive pulsed dispensing operations of, for example, dots of liquid 40 through an exit or discharge passage 42, the actuation air space or volume 34 will increase.

When the syringe is full of liquid 32, the liquid volume takes up much of the interior volume of the syringe 20, leaving a small pressurizable air volume 34. When the air space or volume 34 is small, a small mass of air will be required to achieve the proper actuation air pressure amplitude. However, without the air input flow rate controller 30, the dot size or discharge volume 40 of the liquid will become smaller as the volume of the liquid 32 in the syringe 20 decreases and the air volume or space 34 increases. That is, the air mass flowing through the actuation air input passage must increase and, therefore, air must be directed into the air space 34 for a longer time period to pressurize the syringe 20 to the proper actuation air pressure amplitude. The air input flow rate controller 30, in this example, increases the cross sectional area of the input orifice or passage as the air volume or space 34 enlarges or increases. This allows for an increased flow of air mass or mass flow rate into the syringe air space 34 and, therefore, achieves the set pressure amplitude in the same amount of time as the previous dispense cycle. Therefore, the dispense cycle time is the same duration even as the level of the liquid 32 in the syringe 20 decreases, thereby improving dot-to-dot volume consistency.

Controlling the air flow through the input passage of the apparatus may be achieved in various ways using a flow rate controller. For example, the flow rate controller may be a needle valve or a proportional solenoid valve through which the actuation air is directed upstream of the air space 34. Either of these two types of valves, or other devices, may be used to vary the mass flow rate of actuation air or, in other words, the air mass flowing into the syringe per unit time.

Figure 2:
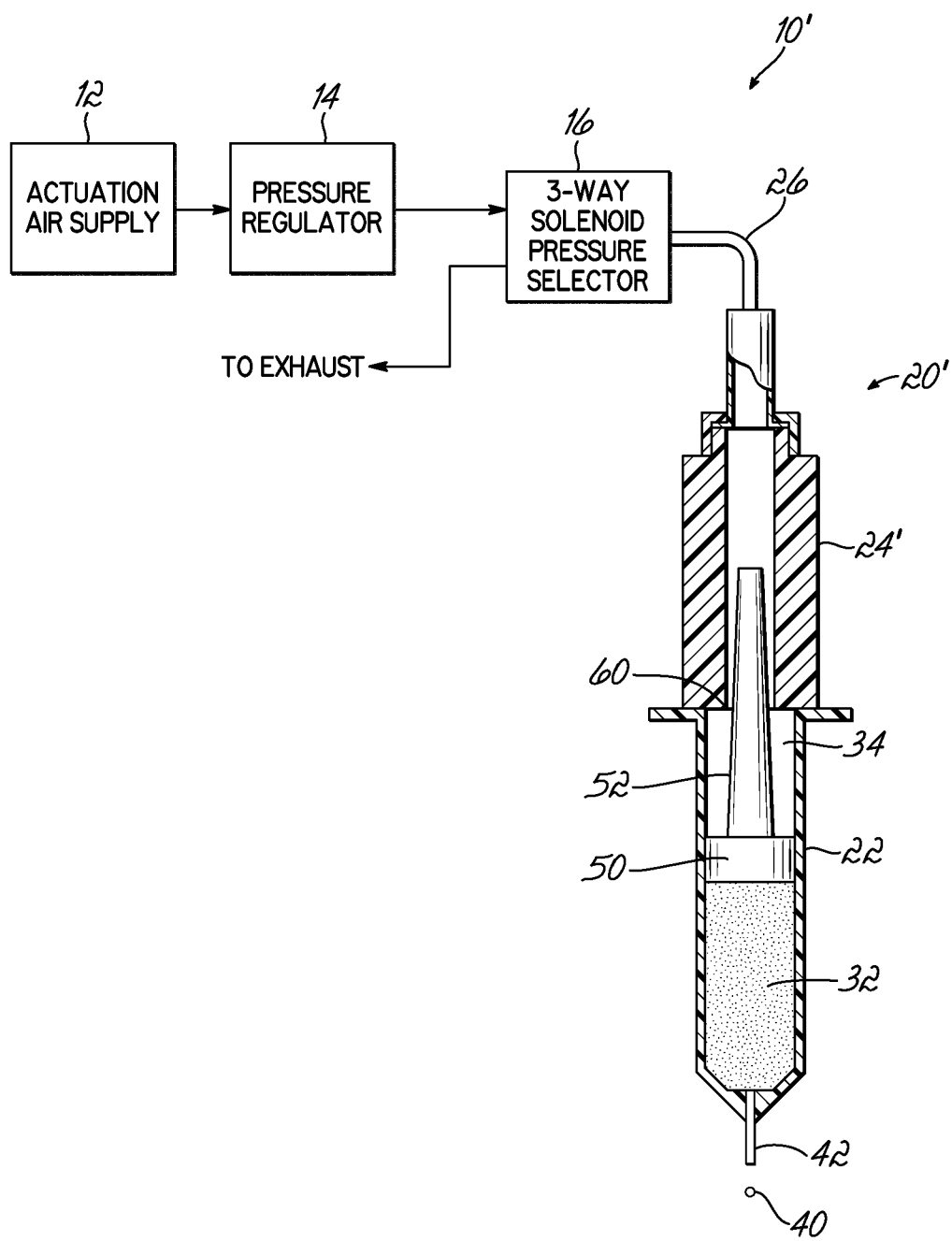
FIG. 2 is a schematic view of an apparatus constructed in accordance with an embodiment including an input passage flow rate regulator incorporated directly into the syringe dispenser.

FIG. 2 illustrates an illustrative embodiment in which an actuation air input passage flow rate controller has been incorporated directly into a syringe dispenser 20' and, more specifically, into the adaptor 24'. In this embodiment like reference numerals indicate like structure and function with respect to like reference numerals in FIG. 1, and therefore require no further discussion. Like reference numerals with prime (') marks refer to somewhat modified structure, as compared to FIG. 1, as will be apparent from the drawings and/or discussion herein. The syringe dispenser 20' further includes a piston 50 mounted for movement within the syringe body structure 22 and a plunger or elongated member 52 extending upwardly from the piston 50, or in a direction away from the exit passage 42. The plunger 52 is designed such that its cross-sectional area at the actuation air entry point or input orifice 60 of the syringe body structure 22 is less than its cross-sectional area within the air space 34 closer to the piston 50. The plunger 52 may be a cone-shaped member having a continuous taper. As the piston and plunger move toward the exit passage 42, the cross-sectional area of the portion of plunger 52 located at the orifice 60 decreases. Therefore, the overall annular, cross sectional orifice area through which pressurized actuation air may enter the syringe body structure 22 increases. This allows more air mass to enter the syringe body structure 22 per unit time, i.e., this increases the air input flow rate. Thus, the air space 34 may be pressurized to the required amount in the same amount of time regardless of the amount or volume of liquid 32 in the syringe body structure 22.

As an example, the elongated member or plunger 52 used for a 30 cc syringe can be 3.025" in length. In this example, the orifice 60 can have a diameter of 0.150". The diameter of the section of the elongated member 52 located at the orifice 60 when the syringe is filled with a liquid is 0.1426". The diameter of the section of the elongated member 52 located at the orifice 60 when the syringe is empty of liquid is 0.1031". A viscous liquid of approximately 330 centipoise may be utilized to dispense dots of the liquid with air pressure pulses of 0.100 second duration at 50 psi.

While the present invention has been illustrated by a description of various preferred embodiments and while these embodiments have been described in some detail, it is not the intention of the Applicants to restrict or in any way limit the scope of the appended claims to such detail. Additional advantages and modifications will readily appear to those skilled in the art. The various features discussed herein may be used alone or in any combination depending on the needs and preferences of the user. This has been a description of illustrative aspects and embodiments of the present invention, along with the preferred methods of practicing the present invention as currently known. However, the invention itself should only be defined by the appended claims.

What is claimed is:

1. A method of dispensing controlled amounts of liquid from a syringe dispenser, comprising:
   coupling a supply of pressurized actuation air to a syringe body structure through an input passage;
   supplying a first timed pulse of the actuation air at a first flow rate through the input passage and against a piston mounted for movement in the syringe body structure, to thereby expel a first amount of the liquid through an exit;
   using an air input flow rate controller positioned at the syringe to increase the flow rate from the first flow rate to a second flow rate in accordance with a relationship depending at least partially on a reduction of liquid volume in the syringe body structure; and
   supplying a second timed pulse of the actuation air through the input passage at the second flow rate and against the piston to thereby expel a second amount of the liquid through the exit passage,
   wherein using the air input flow rate controller further comprises moving a plunger through the input passage at the syringe body structure to enlarge a cross sectional area of the input passage, the plunger being coupled to the piston such that movement of the piston against the liquid to thereby expel an amount of the liquid automatically causes movement of the plunger, thereby automatically enlarging the cross sectional area of the input passage.

2. The method of claim 1, wherein the second amount is at least substantially the same as the first amount.

3. The method of claim 1, wherein the input passage has an annularly shaped cross-section and enlarging the cross sectional area of the input passage further comprises enlarging the area of the annularly shaped cross-section.

4. The method of claim 3, wherein moving the plunger through the input passage further comprises moving an elongate plunger through the input passage.

5. The method of claim 3, wherein moving the plunger through the input passage further comprises moving an elongate, continuously tapered plunger through the input passage.

6. The method of claim 1, wherein the syringe further comprises a syringe body and an adaptor coupled to the syringe body, and wherein using the air input flow rate controller further comprises:

increasing the flow rate through an outlet portion of the adaptor communicating with an inlet portion of the syringe.

\* \* \* \* \*